(12) United States Patent
Verdant

(10) Patent No.: US 11,509,299 B2
(45) Date of Patent: Nov. 22, 2022

(54) DYNAMIC COMPARATOR

(71) Applicant: Commissariat à l'Energie Atomique et aux Energies Alternatives, Paris (FR)

(72) Inventor: Arnaud Verdant, Grenoble (FR)

(73) Assignee: Commissariat à l'Energie Atomique et aux Energies Alternatives, Paris (FR)

( * ) Notice: Subject to any disclaimer, the term of this patent is extended or adjusted under 35 U.S.C. 154(b) by 0 days.

(21) Appl. No.: 17/647,038

(22) Filed: Jan. 5, 2022

(65) Prior Publication Data

US 2022/0231677 A1 Jul. 21, 2022

(30) Foreign Application Priority Data

Jan. 15, 2021 (FR) ...................................... 2100387

(51) Int. Cl.

| | |
|---|---|
| *H03K 5/22* | (2006.01) |
| *H03K 5/24* | (2006.01) |
| *H03K 5/134* | (2014.01) |
| *H03K 19/094* | (2006.01) |
| *H03K 19/20* | (2006.01) |
| *H03M 1/46* | (2006.01) |
| *H03K 5/00* | (2006.01) |

(52) U.S. Cl.
CPC ........... *H03K 5/2481* (2013.01); *H03K 5/134* (2014.07); *H03K 19/094* (2013.01); *H03K 19/20* (2013.01);
(Continued)

(58) Field of Classification Search
CPC .... H03K 5/2481; H03K 5/134; H03K 19/094; H03K 19/20; H03K 2005/00208;
(Continued)

(56) References Cited

U.S. PATENT DOCUMENTS

| 9,432,008 B2 * | 8/2016 | Le Tual ................. H03K 5/134 |
| 2005/0206425 A1 * | 9/2005 | Shutoku ............... H03H 11/265 |
| | | 327/261 |

(Continued)

FOREIGN PATENT DOCUMENTS

WO 2019229678 A1 12/2019

OTHER PUBLICATIONS

Preliminary Search Report for French Application No. 2100387 dated Sep. 23, 2021, 2 pages.
(Continued)

*Primary Examiner* — Ryan Jager
(74) *Attorney, Agent, or Firm* — Moreno IP Law LLC

(57) ABSTRACT

The present description concerns a comparator (1) of a first voltage (V+) and of a second voltage (V−), comprising first (100) and second (102) branches each comprising a same succession of alternated first (106) and second (108) gates in series between a node (104) and an output (1002; 1022) of the branch (100; 102), wherein: each branch starts with a first gate (106), each gate (106; 108) has a second node (114) receiving a bias voltage, the second node (114) of each first gate (106) of the first branch (100) and of each second gate (108) of the second branch (102) receives the first voltage (V+), the second node of the other gates receiving the second voltage (V−), and an order of arrival of the edges on the outputs (1002; 1022) of the branches determines a result of a comparison.

15 Claims, 6 Drawing Sheets

(52) U.S. Cl.
CPC .. *H03M 1/462* (2013.01); *H03K 2005/00208* (2013.01); *H03K 2217/0018* (2013.01)
(58) Field of Classification Search
CPC .... H03K 2217/0018; H03K 5/24; H03K 5/13; H03M 1/462
USPC .......................................................... 327/65
See application file for complete search history.

(56) References Cited

U.S. PATENT DOCUMENTS

| | | | |
|---|---|---|---|
| 2011/0068965 A1* | 3/2011 | Sasaki ..................... | H03K 7/08 332/110 |
| 2014/0375379 A1* | 12/2014 | Makiyama ........... | H03K 17/687 327/537 |
| 2015/0028930 A1 | 1/2015 | Le Tual et al. | |
| 2022/0182068 A1* | 6/2022 | Verdant ................ | H03K 5/2472 |
| 2022/0231677 A1* | 7/2022 | Verdant ................ | H03K 5/2481 |

OTHER PUBLICATIONS

Shim, Minseob, et al. "Edge-pursuit comparator: An energy-scalable oscillator collapse-based comparator with application in a 74.1 dB SNDR and 20 kS/s 15 b SAR ADC." IEEE Journal of Solid-State Circuits 52.4 (2017) pp. 1077-1090.

* cited by examiner

DYNAMIC COMPARATOR

FIELD

The present disclosure generally concerns electronic circuits, and more particularly the dynamic comparators that may be provided in such electronic circuits.

BACKGROUND

Dynamic comparators have the function of performing the comparison of two signals, in synchronization with a signal, typically a clock signal, and of generating a binary signal having its binary state indicating the result of this comparison.

Dynamic comparators are for example used in successive approximation analog-to-digital converters. In such a converter, the dynamic comparator synchronously generates an output signal representative of the comparison of an analog signal with a quantization threshold voltage. This enable to quantify the residue of the analog signal which is digitized by the converter, at each step of the dichotomizing search of the digital code associated with the analog signal.

As an example, a successive approximation analog-to-digital converter comprises a load distribution node having first electrodes of a plurality of capacitive elements of increasing values connected thereto. The node is loaded with the analog signal to be digitized while a given low voltage, typically a zero voltage, is applied to the second electrodes of the capacitive elements. Then, a high voltage is applied to the second electrode of the capacitive element of highest value and the voltage on the load distribution node is compared, by a dynamic comparator, with a quantization voltage. If the voltage of the load distribution node is higher than the quantization voltage, the second electrode which was biased by the high voltage is rebiased to the low voltage, otherwise the high voltage is maintained. Then, these operations are repeated from the highest capacitance to the lowest capacitance, to obtain the digital code associated with the analog signal to be digitized, from the high or low biasing applied to each of the second electrodes of the capacitive elements.

Among dynamic comparators, dynamic latched comparators are known. A dynamic latched comparator, for example, the dynamic latched comparator illustrated in the English Wikipedia web page relative to comparators, typically comprises two inverters in negative feedback having their outputs set to a high level during a preliminary phase, and a differential pair coupling the inverters to ground, the two input transistors of the differential pair receiving the two signals to be compared. Thus, the signal of highest value received by the input transistors of the differential pair induces a stronger current in the corresponding inverter, which causes a faster switching of the output of this inverter to the low level, and the holding at the low level of the output of the other inverter.

However, in a dynamic latched comparator, manufacturing dispersions between the transistors, in particular between the input transistors of the differential pair, result in comparison errors, and thus in quantization errors when the comparator is implemented in a successive approximation analog-to-digital converter. Further, the gate-drain capacitance of each of the input transistors of the differential pair induces a charge inrush on the input of the comparator, which depends on the switching of the inverter of the comparator associated with this transistor. This charge inrush, commonly called kick-back effect, adversely affects the accuracy of the comparator, and thus of the quantization of an analog signal when the comparator is implemented in a successive approximation analog-to-digital converter.

Among dynamic comparators, edge pursuit dynamic comparators are also known.

FIG. 1 shows an example of a dynamic comparator of edge pursuit type. More particularly, FIG. 1 corresponds to FIG. 2 of M. Shim et al.'s article entitled "Edge-Pursuit Comparator: An Energy-Scalable Oscillator Collapse-Based Comparator With Application in a 74.1 dB SNDR and 20 kS/s 15 b SAR ADC" and published in the IEEE Journal of Solid-State Circuits, Vol. 52, No. 4, April 2017.

The comparator of FIG. 1 relies on an elementary inverting structure formed of a standard CMOS ("Complementary Metal Oxide Semiconductor") inverter biased by a first N-channel MOS transistor connected between the source of the N-channel MOS transistor of the inverter and a reference potential, and by a second P-channel MOS transistor connected between the source of the P-channel MOS transistor of the inverter and a power supply potential. The gates of these first and second transistors receive a same bias voltage, selected from among two voltages VINP and VINM compared by the comparator. By cascading two of these elementary structures and by alternating the bias voltage VINP or VINM of the cascaded elementary structures, for example, so that the upstream elementary structure is biased by voltage VINP and that the downstream elementary structure is biased by voltage VINM, the four following cases can be observed:

rising input edge ("E1" in FIG. 1) on the upstream elementary structure and VINP greater than VINM ("VINP>VINM" in FIG. 1): fast decrease ("F1-d" in FIG. 1) of the output of the upstream elementary structure and fast rise ("F1-u" in FIG. 1) of the output of the downstream elementary structure, rising input edge on the upstream elementary structure and VINP smaller than VINM: slow decrease of the output of the upstream elementary structure and slow rise of the output of the downstream elementary structure, falling input edge ("E2" in FIG. 1) on the upstream elementary structure and VINP greater than VINM ("VINP>VINM" in FIG. 1): slow rise ("S2-d" in FIG. 1) of the output of the upstream elementary structure and slow decrease ("S2-u" in FIG. 1) of the output of downstream elementary structure, and falling input edge on the upstream elementary structure and VINP smaller than VINM: fast rise of the output of the upstream elementary structure and fast decrease of the output of the downstream elementary structure.

The comparator of FIG. 1 comprises two branches, each comprising four elementary structures. The two branches are connected in a loop by two NAND-type gates A and B, to form a ring-shaped structure. In one of the branches (the top branch in FIG. 1), the elementary structures are alternately biased by voltages VINP and then VINM, while the inverse occurs in the other branch (the bottom branch in FIG. 1). Further, the input of each NAND gate which is not connected to the output of a branch receives a synchronization signal START.

This comparator operates as follows. In the initial state, signal START is in the low state, whereby the output of each logic gate A and B is in the high state and the output of each branch, including the comparator output COMP, is also in the high state. The switching to the high state of signal START, that is, a rising edge on signal START, causes the switching to the low state of each gate A and B, that is, a falling edge is supplied to the ring-shaped structure of the comparator by each of gates A and B. These two edges will propagate at different speeds in the ring, which depend on bias voltages VINP and VINM. The two edges then propagate through the ring (arrow 11 in FIG. 1) of the comparator until the fast edge reaches, or catches up with, the slow edge, which results in a stabilization of the outputs of the elementary structures of the two branches, of the outputs of logic gates A and B, and of the comparator output COMP. For example, in the configuration of FIG. 1, output COMP stabilizes at the high level when voltage VINP is greater than voltage VINM, and at the low level when voltage VINP is smaller than voltage VINM.

In a comparator of edge pursuit type, the sequence of fast transitions on the two branches tends to average the kick-back effect. This enables to decrease the negative influence of this kick-back effect with respect to the case of a dynamic latched comparator. Similarly, the comparison errors induced by manufacturing dispersions, as well as the temporal noise, are decreased with respect to a dynamic latched comparator. More exactly, the more the number of elementary structures per branch increases, the more these comparison errors and this temporal noise are smoothed.

However, a disadvantage of the comparator of FIG. 1 is that the stabilization time of its ring, and thus of its output COMP, increases with the decrease of the interval between the voltages VINP and VINM which are compared. The increase of the stabilization time is not desirable, particularly since it induces an increase in the power consumption.

SUMMARY

There is a need to overcome all or part of the disadvantages of known dynamic comparators.

For example, there is a need to overcome all or part of the disadvantages of the above-described known dynamic comparators.

An embodiment overcomes all or part of the disadvantages of known dynamic comparators.

For example, an embodiment overcomes all or part of the disadvantages of the above-described known dynamic comparators.

An embodiment provides a dynamic comparator of a first voltage and of a second voltage, comprising first and second branches, each comprising a same succession of first and second alternated logic gates in series between a first node and an output of said branch, wherein:
each branch starts with a first logic gate,
each of the first and second logic gates has a second node configured to receive a bias voltage,
the second node of each first logic gate of the first branch and of each second logic gate of the second branch receives the first voltage and the second node of each second logic gate of the first branch and of each first logic gate of the second branch receiving the second voltage, so that an edge on the first node propagates through the first and second branches at speeds determined by the first and second voltages, and an order of arrival of the edges propagated by the first and second branches, on the outputs of said branches, determines a result of a comparison of the first and second voltages.

According to an embodiment, each of the first and second logic gates implements an inverting function.

According to an embodiment, the edge on the first node is a rising edge, the voltage on the second node of each first logic gate determining a speed of switching to the low state of said logic gate, and the voltage on the second node of each second logic gate determining a speed of switching to the high state of said logic gate or, according to another embodiment, the edge on the first node is a falling edge, the voltage on the second node of each first logic gate determining a speed of switching to the high state of said logic gate, and the voltage on the second node of each second logic gate determining a speed of switching to the low state of said logic gate.

According to an embodiment, each of the first and second logic gates comprises:
at least one first MOS transistor configured to switch said logic gate to the high state when said logic gate receives a rising edge; and
at least one second MOS transistor configured to switch said logic gate to the low state when said logic gate receives a rising edge, and, further:
said at least one first transistor of each first logic gate is biased from the voltage on the second node of said logic gate and said at least one second transistor of each second logic gate is biased from the voltage on the second node of said logic gate, when the edge on the first node is a rising edge, or
said at least one second transistor of each first logic gate is biased from the voltage on the second node of said logic gate and said at least one first transistor of each second logic gate is biased from the voltage on the second node of said logic gate, when the edge on the first node is a falling edge.

According to an embodiment, each of the first and second logic gates comprises a third MOS transistor having a gate connected to the second node of said logic gate, the third transistor of each first logic gate being in series with said at least one first transistor when the edge on the first node is a falling edge, or in series with said at least one second transistor when the edge on the first node is a rising edge, and the third transistor of each second logic gate being in series with said at least one first transistor when the edge on the first node is a rising edge, or in series with said at least one second transistor when the edge on the first node is a falling edge.

According to an embodiment, the first and second transistors of each first and second logic gates are implemented on semiconductor on insulator, possibly on fully depleted semiconductor on insulator and, further:
a back gate of each first transistor of each first logic gate is connected to the second node of said first logic gate and a back gate of each second transistor of each second logic gate is connected to the second node of said second logic gate when the edge on the first node is a falling edge; or
a back gate of each second transistor of each first logic gate is connected to the second node of said first logic gate and a back gate of each first transistor of each second logic gate is connected to the second node of said second logic gate when the edge on the first node is a rising edge.

According to an embodiment, each of the first and second logic gates comprises a single first transistor and a single second transistor.

According to an embodiment:
each first logic gate comprises:
  a first MOS transistor coupling an output of said logic gate to a third node; and
  a second transistor in series with a third transistor or an assembly of third transistors between the output of said logic gate and a fourth node, each third transistor having a gate connected to an input of said logic gate, and each third transistor being biased from the voltage on the second node of the logic gate;

each second logic gate comprises:
  a fourth transistor coupling an output of said logic gate to the fourth node; and
  a fifth transistor in series with a sixth transistor or an assembly of sixth transistors between the output of said logic gate and the third node, each sixth transistor having a gate connected to an input of said logic gate, and each sixth transistor being biased from the voltage on the second node of the logic gate;
the first and fourth transistors are configured to be in the on state when a first signal is active, and the second and fifth transistors are configured to be in the off state when a second signal is active; and
the third node is one of a node configured to receive a power supply voltage and of a node configured to receive a reference voltage, the fourth node being the other one of said nodes.

According to an embodiment:
each first logic gate comprises a seventh MOS transistor having a gate connected to the second node of said first logic gate, the seventh transistor being in series with the second transistor between the fourth node and the output of said first logic gate; and
each second logic gate comprises an eighth MOS transistor having a gate connected to the second node of said second logic gate, the eighth transistor being in series with the fifth transistor between the third node and the output of said second logic gate.

According to an embodiment:
each third transistor of each first logic gate is implemented on semiconductor on insulator, possible on fully depleted semiconductor on insulator, and comprises a back gate connected to the second node of said logic gate; and
each fifth transistor of each second logic gate is implemented on semiconductor on insulator, possible on fully depleted semiconductor on insulator, and comprises a back gate connected to the second node of said logic gate.

According to an embodiment, each first logic gate comprises a single third transistor and each second logic gate comprises a single fifth transistor.

According to an embodiment, the comparator further comprises a control circuit configured to:
switch the first signal to the active state and then the second signal to the active state during an initialization phase prior to a supply of said edge on the first node; and
switch the first and second signals to an inactive state at the end of the initialization phase.

According to an embodiment:
the edge on the first node is a rising edge, the third node being the node of application of the power supply voltage and the fourth node being the node of application of the reference voltage; or
the edge on the first node is a falling edge, the third node being the node of application of the reference voltage and the fourth node being the node of application of the power supply voltage.

According to an embodiment, the comparator further comprises a storage circuit comprising a first input connected to the output of the first branch, a second input connected to the output of the second branch, and an output determined by the order of arrival, on the first and second inputs, of the edges propagated by the first and second branches, the storage circuit for example comprising:
  two NAND logic gates connected in a loop, one of the two logic gates having an input connected to the first input of said circuit and the other one of the two logic gates having an input connected to the second input of said circuit; or
  two NOR logic gates connected in a loop, one of the two logic gates having an input connected to the first input of said circuit and the other one of the two logic gates having an input connected to the second end of said circuit; or
  a D-type flip-flop.

Another embodiment provides an analog-to-digital converter comprising a comparator such as described.

BRIEF DESCRIPTION OF THE DRAWINGS

The foregoing features and advantages, as well as others, will be described in detail in the following description of specific embodiments given by way of illustration and not limitation with reference to the accompanying drawings, in which.

DETAILED DESCRIPTION OF THE PRESENT EMBODIMENTS

Figure 1:
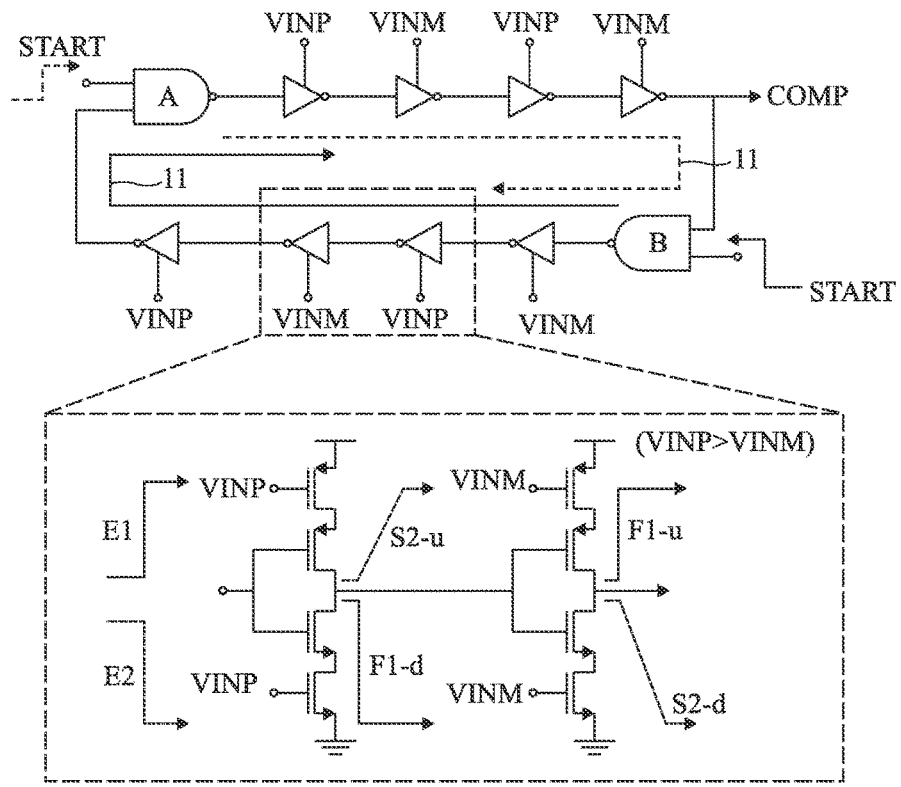
FIG. 1, previously described, shows an example of a dynamic comparator of edge pursuit type.

Like features have been designated by like references in the various figures. In particular, the structural and/or functional features that are common among the various embodiments may have the same references and may dispose identical structural, dimensional and material properties.

For the sake of clarity, only the steps and elements that are useful for an understanding of the embodiments described herein have been illustrated and described in detail. In particular, the usual electronic circuits where a dynamic comparator is implemented have not been detailed, the described embodiments being compatible with these usual circuits.

Unless indicated otherwise, when reference is made to two elements connected together, this signifies a direct connection without any intermediate elements other than conductors, and when reference is made to two elements coupled together, this signifies that these two elements can be connected or they can be coupled via one or more other elements.

In the following disclosure, unless otherwise specified, when reference is made to absolute positional qualifiers, such as the terms "front", "back", "top", "bottom", "left", "right", etc., or to relative positional qualifiers, such as the terms "above", "below", "upper", "lower", etc., or to qualifiers of orientation, such as "horizontal", "vertical", etc., reference is made to the orientation shown in the figures.

Unless specified otherwise, the expressions "around", "approximately", "substantially" and "in the order of" signify within 10%, and preferably within 5%.

In the following description, in a branch of logic gates in series, it is considered that a first logic gate of the branch precedes, or is upstream of, a second logic gate of the branch, when an edge propagating through the branch is first propagated by, or through, the first gate and then by, or through, the second gate and, conversely, that a first logic gate of the branch follows, or is downstream of, a second logic gate of the branch when an edge propagating through the branch is first propagated by, or through, the second gate and then by, or through, the first gate. In other words, the terms "upstream", "downstream", "previous", and "following" applied to the gates of a branch are defined with respect to the propagation direction of the edges in said branch.

In the following description, an edge, or a binary transition, may be of two types or directions, that is, the rising type and the falling type. A rising-type, respectively falling-type, edge, will more generally be called rising edge, respectively falling edge.

In the following description, logic gate designates a purely combinational gate or circuit, that is, comprising no storage functions.

The present application provides a dynamic comparator of edge race type, where an edge is supplied to two concurrent branches each comprising a same succession of logic gates in series, so that this edge is propagated in each of the two branches. The gates of a branch are alternately biased from a first voltage and from a second voltage to be compared with the first voltage, and the gates of the other branch are biased complementarily, that is, alternately from the second voltage and from the first voltage. Due to the fact that each of the first and second voltages determines the propagation speeds of an edge in each gate that it biases, the order of arrival of the edge propagated by each of the branches indicates whether the first voltage is or not greater than the second voltage. This result of the comparison of the first and second voltage can be stored by providing a storage circuit connected to the outputs of the two branches.

Figure 2:
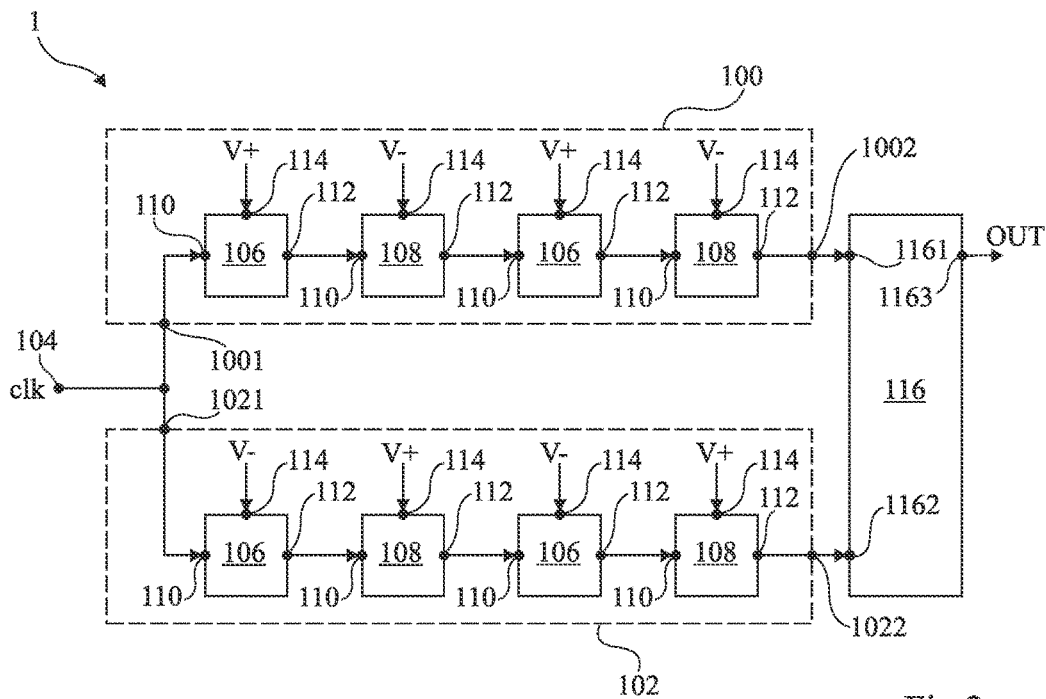
FIG. 2 very schematically shows in the form of blocks an example of a dynamic comparator according to an embodiment.

FIG. 2 schematically shows in the form of blocks an embodiment of such a comparator 1. Comparator 1 is configured to compare a voltage V+ with a voltage V−.

Comparator 1 comprises two branches 100 and 102, delimited by dotted lines in FIG. 2. Branches 100, 102 are configured to propagate, concurrently, that is, in parallel, an edge received on a node 104 of comparator 1. Thus, branch 100, respectively 102, comprises an input 1001, respectively 1021, coupled, preferably connected, to node 104. As an example, the signal received by node 104 is a synchronization signal, for example, a clock signal clk.

Each of branches 100 and 102 comprises a same succession of series-connected alternated logic gates 106 and 108. The gates 106 and 108 of branch 100, respectively 102, are connected in series or in cascade between input 1001, respectively 1021, and an output 1002, respectively 1022, of the branch. Each branch 100, 102 starts with a gate 106. In other words, the first gate of each branch 100, 102 is a gate 106.

Each gate 106, 108 comprises an input 110 and an output 112. Each gate 106, 108 is configured to receive an edge to be propagated on its input 110, called data input, and to propagate this edge on its output 112. More particularly, when it propagates an edge, each gate 106, 108 is configured so that the edge supplied by its output 112 is of a type, or direction, opposite to that of the edge received by its input 110. In other words, each gate 106, 108 implements an inverting function between its input 110 and its output 112.

In each branch 100, 102, the data input 110 of each gate 106, 108 is connected to the output 112 of the immediately preceding gate 108, 106 in the branch, or to the input 1001, 1021 of branch 100, 102 when this gate is the first gate 106 in the branch.

Preferably, each branch 100, 102 comprises as many gates 106 as gates 108, as is particularly true in FIG. 2, although the described embodiments are not limited to this example.

In the specific example of FIG. 2, each branch 100, 102 comprises two gates 106 and two gates 108. However, the number of gates 106 and/or the number of gates 108 per branch may be different from two, for example, be greater than two, or be equal to 1.

Each gate 106, 108 comprises a node 114, called bias node, configured to receive a voltage for biasing the gate. Each gate 106, 108 is configured so that the speed of propagation of an edge by this gate is determined by the bias voltage that it receives on its bias input 114.

According to an embodiment, where the edge on node 104 triggering a comparison of voltage V+ and V− is a rising edge, the voltage V+ or V− on the node 114 of each gate 106 determines a speed of switching to the low state of this gate 106, and the voltage on the node 114 of each gate 108 determines a speed of switching to the high state of this gate. In an alternative embodiment, the edge on node 104 triggering a comparison is a falling edge, the voltage on the node 114 of each gate 106 determines a speed of switching to the high state of this gate, and the voltage on the node 114 of each gate 108 determines a speed of switching to the low state of this gate.

The gates 106, 108 of a first branch, branch 100 in the example of FIG. 2, alternately receive voltage V+ and voltage V− on their respective nodes 114, the gates 106, 108 of the second branch, branch 102 in the example of FIG. 2, being biased complementarily to the gates 106, 108 of the first branch, that is, the gates 106, 108 of the second branch alternately receive voltage V− and voltage V+ on their respective nodes 114. In other words, in the example of FIG. 2, the node 114 of each gate 106 of branch 100 and of each gate 108 of branch 102 receives voltage V+, and the node 114 of each gate 108 of branch 100 and of each gate 106 of branch 102 receives voltage V−.

Thus, when voltages V+ and V− are different, the edge propagates at different speeds in branches 100 and 102. This results from the fact that the speed of propagation of an edge by each gate 106, 108 depends on the voltage V+ or V− that it receives on its node 114, and that the gates of branch 100 are biased complementarily to those of branch 102.

Due to the fact that a difference between the voltages V+ and V− to be compared causes a corresponding difference in propagation speed between branches 100 and 102, the order of arrival of the edge propagated by each branch 100, 102, on the output 1001, 1021 of this branch, enables to determine whether voltage V+ is or not greater than voltage V−.

According to an embodiment, comparator 1 comprises a storage circuit 116. Circuit 116 comprises an input 1161 coupled, preferably connected, to the output 1102 of branch 102, and an input 1162 coupled, preferably connected, to the output 1022 of branch 102. Circuit 116 comprises an output 1163. Output 1163, that is, more exactly its binary state, is determined by the order of arrival, on inputs 1161 and 1162, of the edges propagated by respective branches 100 and 102. In other words, output 1163 delivers a binary signal OUT having a first binary state indicating that the edge propagated by branch 100 has reached input 1161 before the edge propagated by branch 100 has reached input 1162, and having a second binary state indicating that the edge propagated by branch 100 has reached input 1161 after the edge propagated by branch 100 has reached input 1162.

As an example, circuit 116 may comprise two NAND gates connected in a loop, one of the two gates having an input connected to the input 1161 of circuit 116, and the other one of the two gates having an input connected to the input 1162 of circuit 116. Output 1163 then corresponds to the output of one or the other of the two gates. Circuit 116 is for example adapted to the case where the edge propagated by each branch 100, 102 is of rising type when it reaches the corresponding input 1161, 1162 of circuit 116.

According to another example, circuit 116 comprises two NOR gates connected in a loop, one of the two gates having an input connected to the input 1161 of circuit 116, and the other one of the two gates having an input connected to the input 1162 of circuit 116. Output 1163 then corresponds to the output of one or the other of the two gates. This circuit 116 is for example adapted to the case where the edge propagated by each branch 100, 102 is of falling type when it reaches the corresponding input 1161, 1162 of circuit 116.

According to still another example, circuit 116 comprises a D-type flip-flop having a D date input coupled, preferably connected, to one of inputs 1161 and 1162, and a C synchronization input coupled, preferably connected, to the other one of inputs 1161 and 1162. In the case where the propagated edges received on inputs 1161 and 1162 are rising, respectively falling, input C is active on a rising, respectively falling, edge. Output 1163 then corresponds to an output of the D flip-flop.

It will be within the abilities of those skilled in the art to provide other examples of storage circuit 116.

An advantage of comparator 1 over a comparator of the type of that in FIG. 1 comprising as many inverting elementary structures as comparator 1 comprises gates 106, 108 is that the result of the comparison of voltages V+ and V− is obtained faster with comparator 1. Indeed, branches 100 and 102 of comparator 1 are not connected in a loop as in FIG. 1. As a result, the number of gates 106, 108 crossed by an edge in comparator 1 before obtaining the result of the comparison of voltage V+ with voltage V− is smaller than the number of elementary inverting structures crossed by an edge in the comparator of the type of that in FIG. 1 before obtaining the result of the comparison of voltage VINP with voltage VINM. In other words, the response time of comparator 1 is shorter than the response time of the comparator of FIG. 1. This is all the truer as the voltages to be compared are close to each other.

Further, in comparator 1, the type of edge, that is, rising or falling, which is supplied to node 104 is generally known, whereby the type of edge received by the input 110 of each gates 106 and 108 of comparator 1 is known. As will be described hereafter, advantage is taken from this a priori knowledge of the type of edge received by each gate for the implementation thereof.

Various embodiments and alternative embodiment of gates 106 and 108 will now be described. Preferably, all gates 106 are implemented in the same way, possibly except for the voltage V+ or V− that they receive on their nodes 114, gates 108 being preferably all implemented in the same way, possibly except for the voltage V+ or V− that they receive on their nodes 114.

Figure 3:
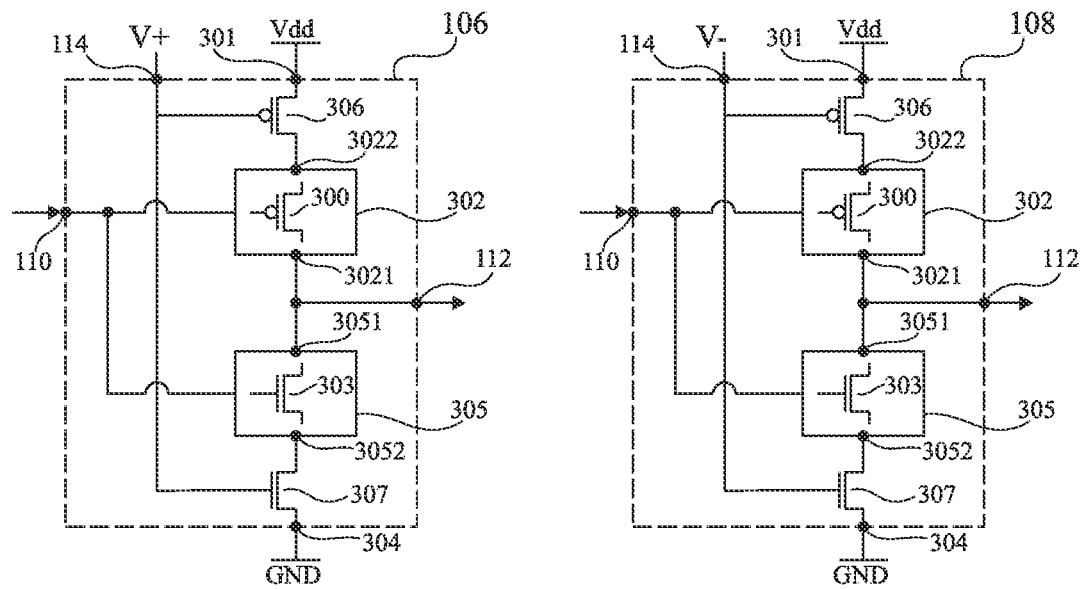
FIG. 3 shows an example of two gates of the comparator of FIG. 2 according to an embodiment.

FIG. 3 schematically shows an embodiment of a gate 106 (on the left-hand side in FIG. 3) and of a gate 108 (on the right-hand side in FIG. 3) of the comparator 1 of FIG. 2. In the example of FIG. 3, gates 106 and 108 belong to branch 100 of comparator 1, and voltage V+, respectively V−, is received by the node 114 of gate 106, respectively 108. In another example, not illustrated, gates 106 and 108 belong to branch 102, and voltage V−, respectively V+, is received by the node 114 of gate 106, respectively 108.

Each gate 106, 108 comprises at least one MOS transistor 300, preferably with a P channel, configured to switch the gate, that is, its output 112, to the high state when the gate, that is, its input 110, receives a falling edge. As an example, transistor(s) 300 couple the output 112 of the gate to a node 301 of application of a power supply voltage Vdd.

In FIG. 3, in each gate 106, 108, transistor 300, or the assembly of transistors 300 when the gate comprises a plurality of transistors 300, is schematically shown in the form of a block 302. As an example, when the gate comprises a plurality of MOS transistors 300, these transistors are associated in series and/or in parallel between a node 3021 coupled, for example, connected, to output 112, and a node 3022 coupled to node 301.

Each gate 106, 108 further comprises at least one MOS transistor 303, preferably with an N channel, configured to switch the gate to the low state when the gate receives a rising edge. As an example, transistor(s) 303 couple the output 112 of the gate to a node 304 of application of a reference voltage GND, for example, the ground.

In FIG. 3, in each gate 106, 108, transistor 303, or the assembly of transistors 303 when the gate comprises a plurality of transistors 303, is schematically shown in the form of a block 305. As an example, when the gate comprises a plurality of MOS transistors 303, these transistors are associated in series and/or in parallel between a node 3051 coupled, for example, connected, to output 112, and a node 3052 coupled to node 304.

In each logic gate 106, 108, a gate of each transistor 300, 303 is, preferably, connected to the input 110 of the logic gate.

According to a first embodiment, the edge applied to node 104 (FIG. 2) to trigger a comparison of voltages V+ and V− is a rising edge. In this first embodiment, the transistor(s) 303 of gate 106 are then biased from the voltage on the node 114 of gate 106, and the transistor(s) 300 of gate 108 are biased from the voltage on the node 114 of gate 108.

More particularly, in this first embodiment, gate 106 comprises a MOS transistor 307, preferably with an N channel, for biasing transistor(s) 303 from the voltage on node 114. Transistor 307 has a gate connected to the node 114 of logic gate 106. Further, transistor 307 is in series with transistor 303, or the assembly of transistors 303, of gate 106, between node 304 and the output 112 of gate 106. Preferably, transistor 307 has a conduction terminal, for example, its source, coupled, preferably connected, to node 304, and another conduction terminal, for example, its drain, coupled, preferably connected, to node 3052. In another example, not illustrated, transistor 307 is arranged between block 305 and output 112. However, as compared with the example where transistor 307 is arranged between node 304 and block 305, the sensitivity to the kick-back effect is greater in the example where transistor 307 is arranged between block 305 and output 112.

Further, in this first embodiment, gate 108 comprises a MOS transistor 306, preferably with a P channel, for biasing the transistor(s) 300 of gate 108 from the voltage on the node 114 of gate 108. Transistor 306 has a gate connected to the node 114 of logic gate 108. Further, transistor 306 is in series with transistor 300, or the assembly of transistors 300, of gate 108, between node 301 and the output 112 of gate 108.

Preferably, transistor 306 has a conduction terminal, for example, its source, coupled, preferably connected, to node 301, and another conduction terminal, for example, its drain, coupled, preferably connected, to node 3022. In another example, not illustrated, transistor 306 is arranged between block 302 and output 112. However, as compared with the example where transistor 306 is arranged between node 301 and block 302, the sensitivity to the kick-back effect is greater in the example where transistor 306 is arranged between block 302 and output 112.

According to a first example of implementation of the first embodiment, as illustrated in FIG. 3, the transistor(s) 300 of gate 106 are also biased from the voltage on node 114 of gate 106, and the transistor(s) 303 of gate 108 are also biased from the voltage on the node 114 of gate 108. Logic gate 106 then comprises, like logic gate 108, a transistor 306, preferably with a P channel, having a gate connected to the node 114 of logic gate 108, and being in series with the transistor 300, or the assembly of transistors 300, of logic gate 106, between node 301 and the output 112 of gate 106. Further, logic gate 108 then comprises, like logic gate 106, a transistor 307, preferably with an N channel, having a gate connected to the node 114 of logic gate 108, and being in series with the transistor 303 or the assembly of transistors 303 of gate 108, between node 304 and the output 112 of gate 108.

According to a second example, not illustrated, of implementation of the first embodiment, the transistor(s) 300, respectively 303, of gate 106, respectively 108, are not biased from voltages V+ and V−. In this second example, the transistor 306 of gate 106 and the transistor 307 of gate 108 may be omitted.

According to a third example, not illustrated, of implementation of the first embodiment, when the transistor(s) 303 of gate 106 are biased from the voltage V+, respectively V−, received by the node 114 of gate 106, the transistor(s) 300 of gate 106 are biased from the voltage V−, respectively V+, received by an additional bias node of gate 106. Similarly, when the transistor(s) 300 of gate 108 are biased from the voltage V−, respectively V+, received by the node 114 of gate 108, the transistor(s) 303 of gate 108 are biased from the voltage V+, respectively V−, received by an additional bias node of gate 108. In this third example, logic gate 106 comprises transistor 306 but, unlike what is illustrated in FIG. 3, its gate is connected to the additional bias node of logic gate 106 and logic gate 108 comprises transistor 307 but, unlike what is illustrated in FIG. 3, its gate is connected to the additional bias node of logic gate 108.

Examples of implementation of a first embodiment where the edge applied to node 104 (FIG. 2) to trigger a comparison of voltages V+ and V− is a rising edge have been considered hereabove. A second embodiment where the edge applied to node 104 (FIG. 2) to trigger a comparison of voltages V+ and V− is a falling edge is now considered. In this second embodiment, the transistor(s) 300 of gate 106 are then biased from the voltage on the node 114 of gate 106, and the transistor(s) 303 of gate 108 are biased from the voltage on the node 114 of gate 108.

In this second embodiment, gate 106 then comprises transistor 306 in series with transistor(s) 300, between node 301 and the output 112 of gate 106, gate 108 comprising transistor 307 in series with transistor(s) 303, between node 304 and the output 112 of gate 108. The gate of the transistor 306 of logic gate 106 is connected to the node 114 of gate 106, the gate of the transistor 307 of logic gate 108 being connected to the node 114 of gate 108.

According to a first example of implementation of the second embodiment, illustrated in FIG. 3, the transistor(s) 303 of gate 106 are also biased from the voltage on the node 114 of gate 106, and the transistor(s) 300 of gate 108 are also biased from the voltage on the node 114 of gate 108. Logic gate 106 then comprises transistor 307, in series with the transistor(s) 303 of logic gate 106, between node 304 and the output 112 of logic gate 106, the gate of this transistor 307 being connected to the node 114 of logic gate 106. Further, logic gate 108 then comprises transistor 306, in series with the transistor(s) 300 of logic gate 108, between node 301 and the output 112 of logic gate 108, the gate of this transistor 306 being connected to the node 114 of logic gate 108.

According to a second example, not illustrated, of implementation of the second embodiment, the transistor(s) 303, respectively 300, of gate 106, respectively 108, are not biased from voltages V+ and V−. In this second example, the transistor 307 of gate 106 and the transistor 306 of gate 108 may be omitted.

According to a third example, not illustrated, of implementation of the second embodiment, when the transistor(s) 300 of gate 106 are biased from the voltage V+, respectively V−, received by the node 114 of gate 106, the transistor(s) 303 of gate 106 are biased from the voltage V−, respectively V+, received by an additional bias node of gate 106. Similarly, when the transistor(s) 303 of gate 108 are biased from the voltage V−, respectively V+, received by the node 114 of gate 108, the transistor(s) 300 of gate 108 are biased from the voltage V+, respectively V−, received by an additional bias node of gate 108. In this third example, logic gate 106 comprises transistor 307, but, unlike what is illustrated in FIG. 3, its gate is connected to the additional bias node of logic gate 106, and logic gate 108 comprises transistor 306 but, unlike what is illustrated in FIG. 3, its gate is connected to the additional bias node of logic gate 108.

In the examples of first and second embodiments described hereabove in relation with FIG. 3, transistors 300 and 303 are for example implemented from a semiconductor bulk, from a structure of semiconductor on insulator (SOI) type, or from a structure of fully depleted semiconductor on insulator (FDSOI) type.

Figure 4:
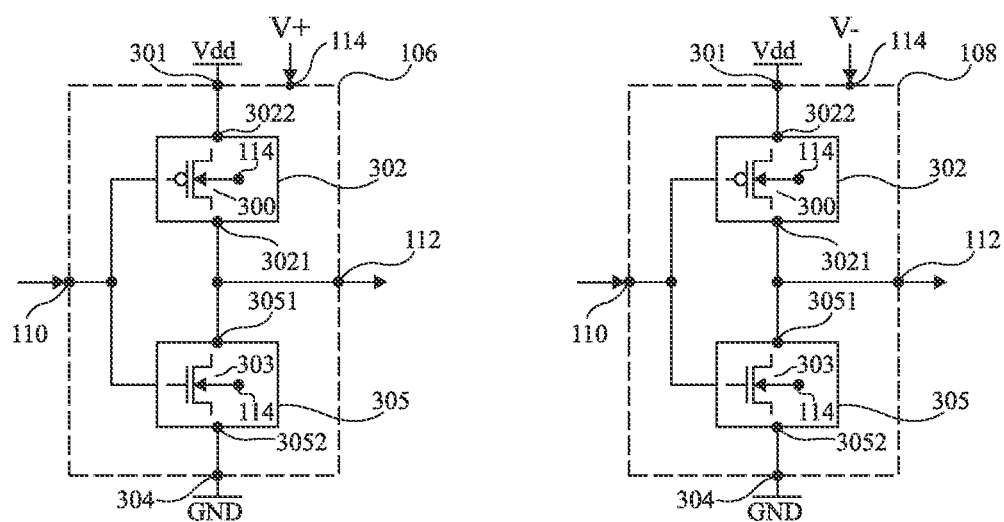
FIG. 4 shows an example of two gates of the comparator of FIG. 2 according to an alternative embodiment.

FIG. 4 schematically shows an alternative embodiment of a gate 106 (on the left-hand side in FIG. 4) and of a gate 108 (on the right-hand side in FIG. 4) of the comparator 1 of FIG. 2. It is here considered, as an example, that these gates 106 and 108 belong to the branch 100 of comparator 1, voltage V+, respectively V−, then being received by the node 114 of gate 106, respectively 108. In another example, not illustrated, these gates 106 and 108 belong to branch 102, and voltage V−, respectively V+, is received by the node 114 of gate 106, respectively 108.

In FIG. 4, as in FIG. 3, each gate 106, 108 comprises transistor(s) 300 (block 302) and transistor(s) 303 (block 305).

In FIG. 4, each transistor 300, 303 of each logic gate 106, 108 is implemented from a SOI structure, preferably from a FDSOI-type structure. Due to the fact that transistors 300 and 303 are implemented on SOI or on FDSOI, each of these transistors 300 and 303 has a back gate in addition to its front gate which is, for example, connected to input 110 of the logic gate.

According to a first alternative embodiment, the edge applied to node 104 (FIG. 2) to trigger a comparison of voltages V+ and V− is a rising edge. In this first alternative embodiment, the transistor(s) 303 of logic gate 106 are then biased from the voltage on the node 114 of gate 106 and the transistors 300 of logic gate 108 are biased from the voltage on the node 114 of gate 108. The back gate of each transistor 303 of gate 106 is then connected to the node 114 of gate 106, the back gate of each transistor 300 of gate 108 being connected to the node 114 of gate 108. Further, in this first variant, transistors 306 and 307 can be omitted, as illustrated in FIG. 4. As a result, the gates 106 and 108 of FIG. 4 are more compact than those of FIG. 3.

According to a first example of implementation of the first alternative embodiment, illustrated in FIG. 4, the transistor(s) 300 of gate 106 are also biased from the voltage on the node 114 of gate 106, and the transistor(s) 303 of gate 108 are also biased from the voltage on the node 114 of gate 108. The back gate of each transistor 300 of gate 106 is then connected to the node 114 of gate 106, the back gate of each transistor 303 of gate 108 being connected to the node 114 of gate 108.

According to a second example, not illustrated, of implementation of the first alternative embodiment, the transistor(s) 300, respectively 303, of gate 106, respectively 108, are not biased from voltages V+ and V−. In this second example, the back gate of each transistor 300 of gate 106 is not connected or coupled to the node 114 of gate 106, and the back gate of each transistor 303 of gate 108 is not connected or coupled to the node 114 of gate 108.

According to a third example, not illustrated, of implementation of the first alternative embodiment, when the transistor(s) 303 of gate 106 are biased from the voltage V+, respectively V−, received by the node 114 of gate 106, the transistor(s) 300 of gate 106 are biased from the voltage V−, respectively V+, received by the additional bias node of gate 106. Similarly, when the transistor(s) 300 of gate 108 are biased from the voltage V−, respectively V+, received by the node 114 of gate 108, the transistor(s) 303 of gate 108 are biased from the voltage V+, respectively V−, received by an additional bias node of gate 108. In this third example, the back gate of each transistor 300 of gate 106 is connected to the additional bias node of gate 106, and the back gate of each transistor 303 of gate 108 is connected to the additional bias node of gate 108.

Examples of implementation of a first alternative embodiment where the edge applied to node 104 (FIG. 2) to trigger a comparison of voltages V+ and V− is a rising edge have been considered hereabove. A second alternative embodiment where the edge applied to node 104 (FIG. 2) to trigger a comparison of voltages V+ and V− is a falling edge is now considered. In this second alternative embodiment, the transistor(s) 300 of gate 106 are then biased from the voltage on the node 114 of gate 106, and the transistor(s) 303 of gate 108 are biased from the voltage on the node 114 of gate 108. The back gate of each transistor 300 of gate 106 is then connected to the node 114 of gate 106, the back gate of each transistor 303 of gate 108 being connected to the node 114 of gate 108. Further, in this second variant, as in the first variant, transistors 306 and 307 may be omitted. As a result, the gates 106 and 108 of FIG. 4 are more compact than those of FIG. 3.

According to a first example of implementation of the second alternative embodiment, illustrated in FIG. 4, the transistor(s) 303 of gate 106 are also biased from the voltage on the node 114 of gate 106, and the transistor(s) 300 of gate 108 are also biased from the voltage on the node 114 of gate 108. The back gate of each transistor 303 of gate 106 is then connected to node 114, the back gate of each transistor 300 of gate 108 being connected to the node 114 of gate 108.

According to a second example, not illustrated, of implementation of the second alternative embodiment, the transistor(s) 303, respectively 300, of gate 106, respectively 108, are not biased from voltages V+ and V−. In this second example, the back gate of each transistor 303 of gate 106 is not connected or coupled to the node 114 of gate 106, and the back gate of each transistor 300 of gate 108 is not connected or coupled to the node 114 of gate 108.

According to a third example, not illustrated, of implementation of the second alternative embodiment, when the transistor(s) 300 of gate 106 are biased from the voltage V+, respectively V−, received by the node 114 of gate 106, the transistor(s) 303 of gate 106 are biased from voltage V−, respectively V+, received by an additional bias node of gate 106. Similarly, when the transistor(s) 303 of gate 108 are biased from the voltage V−, respectively V+, received by the node 114 of gate 108, the transistor(s) 300 of gate 108 are biased from the voltage V+, respectively V−, received by an additional bias node of gate 108. In this case, the back gate of each transistor 303 of gate 106 is connected to the additional bias node, the back gate of each transistor 300 of gate 108 being connected to the additional bias node of gate 108.

Examples of implementation of a first and of a second embodiments of gates 106 and 108 have been described hereabove in relation with FIG. 3 and examples of implementations of a first and of a second alternative embodiments of gates 106 and 108 have been described hereabove in relation with FIG. 4. It will be within the abilities of those skilled in the art to combine the first, second, and third examples of implementation of the first embodiment with, respectively, the first, second, and third examples of implementation of the first alternative embodiment, and to combine the first, second, and third examples of implementation of the second embodiment with, respectively, the first, second, and third examples of implementation of the second alternative embodiment.

Preferably, in the various examples of embodiments and variants described hereabove in relation with FIG. 3 and FIG. 4, each gate 106, 108 comprises a single transistor 300 and a single transistor 303. In this case, in each gate 106, 108, a conduction terminal, for example, the source, of transistor 300 is coupled, preferably connected, to node 3022, another conduction terminal, for example, the drain, of transistor 300 is coupled, preferably connected, to node 3021, a conduction terminal, for example, the source, of transistor 303 is coupled, preferably connected, to node 3052, and another conduction terminal, for example, the drain, of transistor 303 is coupled, preferably connected, to node 3051.

Embodiments of an edge race dynamic comparator have been described hereabove in relation with FIG. 2, FIG. 3, and FIG. 4.

In these embodiments and variants, it has been considered that the type of the edge, that is, rising or falling, which is applied to node 104 to trigger a comparison of voltages V+ and V− is known in advance. However, in the case where this is not true, gates 106 and 108 are implemented as indicated in the first examples of implementation.

It is provided to take further advantage of this a priori knowledge of the type of edge on node 104 to modify the structure of the gates 106, 108 of each branch of the comparator to decrease the power consumption of the comparator.

Figure 5:
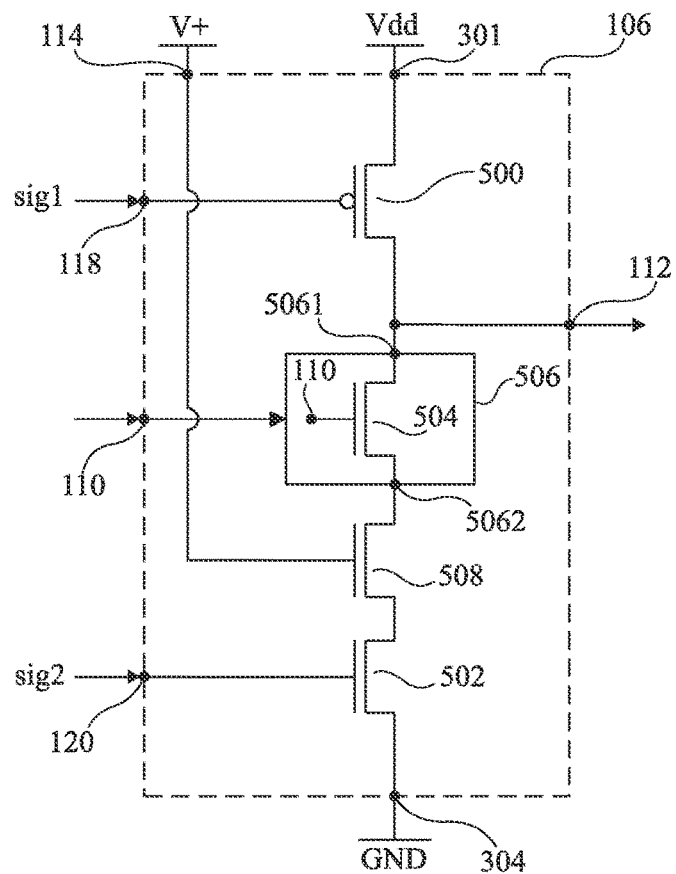
FIG. 5 shows an example of two gates of the comparator of FIG. 2 according to another embodiment.
Figure 5:
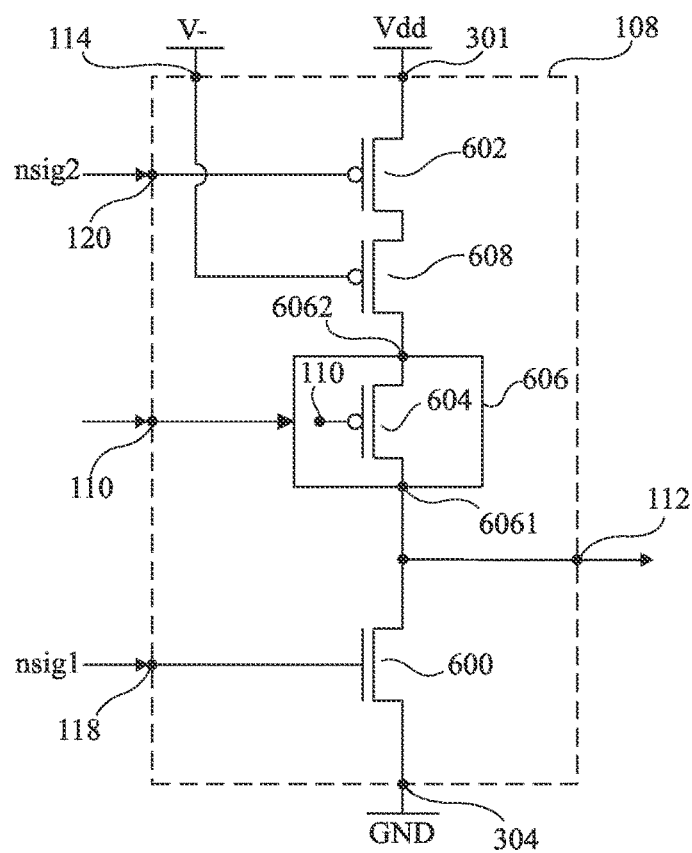

FIG. 5 shows an example of a gate 106 (at the top in FIG. 5) and of a gate 108 (at the bottom in FIG. 6) of the comparator 1 of FIG. 2, according to an embodiment where advantage is taken of the a priori knowledge of the type of edge on the comparator node 104. More particularly, FIG. 5 illustrates a third embodiment where a rising edge is applied to node 104 (FIG. 2) to trigger a phase of comparison of voltages V+ and V−. In this third embodiment, during comparison phase, gate 106 receives a rising edge on its input 110 and gate 108 receives a falling edge on its input 110. In the example of FIG. 5, gates 106 and 108 belong to the branch 100 of comparator 1, and voltage V+, respectively V−, is received by the node 114 of gate 106, respectively 108. In another example not shown, these gates 106 and 108 belong to branch 102, and voltage V−, respectively V+, is received by the node 114 of gate 106, respectively 108.

Gate 106 comprises a MOS transistor 500, for example, with a P channel, coupling the output 112 of the gate to node 301. As an example, transistor 500 has a conduction terminal, for example, its source, coupled, preferably connected, to node 301, and another conduction terminal, for example, its drain, coupled, preferably connected to the gate output 112.

Transistor 500 is configured to be in the on state when a signal sig1 is active, that is, when binary signal sig1 is in a binary state corresponding to this active state. Logic gate 106 thus comprises an input 118, called control input, configured to receive a signal for controlling transistor 500, the gate of transistor 500 being connected to the input 118 of the logic gate. As an example, and as shown in FIG. 5, when the binary state of signal sig1 corresponding to the active state is the low state, and when transistor 500 has a P channel, input 118 receives signal sig1.

Gate 106 further comprises a MOS transistor 502, and a MOS transistor 504 or an assembly of MOS transistors 504. In FIG. 5, transistor 504 or the assembly of transistors 504 when gate 106 comprises a plurality of transistors 504, is schematically shown in the form of a block 506.

As an example, when gate 106 comprises a plurality of MOS transistors 504, these transistors are associated in series and/or in parallel between a node 5061 coupled, for example connected, to output 112, and a node 5062 coupled to node 304. According to another example, when gate 106 comprises a single transistor 504, the latter has a conduction terminal, for example, its source, coupled, preferably connected, to node 5062, and another conduction terminal, for example, its drain, coupled, preferably connected, to node 5061.

Transistor 502 is series-connected with transistor 504 or with the assembly of transistors 504, between output 112 and the node 304 of logic gate 106. The gate of each transistor 504 is connected to the input 110 of the logic gate. Transistors 502 and 504 for example have an N channel. Transistor 502 for example has a conduction terminal, for example, its source, coupled to node 304, and another conduction terminal, for example, its drain, coupled to node 5062.

Transistor 502 is configured to be in the off state when a signal sig2 is active, that is, when binary signal sig2 is in a binary state corresponding to this active state. Logic gate 106 thus comprises an input 120, called control input, configured to receive a signal for controlling transistor 502, the gate of transistor 502 being connected to the input 120 of the logic gate. As an example, and as shown in FIG. 5, when the binary state of signal sig2 corresponding to the active state is the low state, and when transistor 502 has an N channel, input 120 receives signal sig2.

Gate 108 comprises a MOS transistor 600, for example with an N channel, coupling the output 112 of the logic gate to node 304. For example, transistor 600 has a conduction terminal, for example its source, coupled, preferably connected, to node 304, and another conduction terminal, for example its drain, coupled, preferably connected, to the output 112 of the logic gate.

Transistor 600 is configured to be in the on state when signal sig1 is active. Logic gate 108 thus comprises, like logic gate 106, a control input 118 configured to receive a signal for controlling transistor 600, the gate of transistor 600 being connected to the input 118 of the logic gate. As an example, and as shown in FIG. 5, when the binary state of signal sig1 corresponding to the active state is the low state, and when transistor 600 has an N channel, the input 118 of gate 108 receives a signal nsig1 complementary to signal sig1.

Gate 108 further comprises a MOS transistor 602, and a MOS transistor 604 or an assembly of MOS transistors 604. In FIG. 5, transistor 604, or the assembly of transistors 604 when gate 108 comprises a plurality of transistors 604, is schematically shown in the form of a block 606. As an example, when gate 108 comprises a plurality of MOS transistors 604, these transistors are associated in series and/or in parallel between a node 6061 coupled, for example connected, to the output 112 of gate 108, and a node 6062 coupled to node 304. According to another example, when gate 108 comprises a single transistor 604, the latter has a conduction terminal, for example, its source, coupled, preferably connected, to node 6062, and another conduction terminal, for example, its drain, coupled, preferably connected, to node 6061.

Transistor 602 is series-connected with transistor 604 or with the assembly of transistors 604, between the output 112 and the node 304 of logic gate 108. The gate of each transistor 604 is connected to the input 110 of logic gate 108. Transistors 602 and 604 for example have a P channel. Transistor 602 for example has a conduction terminal, for example, its source, coupled to node 301, and another conduction terminal, for example, its drain, coupled to node 6062.

Transistor 602 is configured to be in the off state when signal sig2 is active. Logic gate 108 thus comprises, like logic gate 106, a control input 120 configured to receive a signal for controlling transistor 602, the gate of transistor 602 being connected to the input 120 of logic gate 108. As an example, and as shown in FIG. 5, when the binary state of signal sig2 corresponding to the active state is the low state, and when transistor 602 has a P channel, the input 120 of gate 108 receives a signal nsig2 complementary to signal sig2.

In this third embodiment, the transistor(s) 504 of gate 106 are biased from the voltage on the node 114 of gate 106, the transistor(s) 604 of gate 108 being biased from the voltage on the node 114 of gate 108. In this third embodiment, gate 106 comprises a MOS transistor 508, for example, with an N channel, and gate 108 comprises a transistor 608, for example, with a P channel.

In gate 106, transistor 508 is in series with transistor 502, between node 304 and output 112. In other words, transistor 508 is in series with transistor 502 and transistor 504 or the assembly of transistors 504. For example, transistor 508 couples transistor 502 to block 506. Transistor 508 then has a conduction terminal, for example, its source, coupled, preferably connected, to transistor 502, and another conduction terminal, for example, its drain, coupled, preferably connected, to node 5062. The gate of transistor 508 is connected to the node 114 of logic gate 106.

In gate 108, transistor 608 is in series with transistor 602, between node 301 and the output 112 of gate 108. In other words, transistor 608 is in series with transistor 602 and transistor 604 or the assembly of transistors 604. For example, transistor 608 couples transistor 602 to block 606. Transistor 608 then has a conduction terminal, for example, its source, coupled, preferably connected, to transistor 502, and another conduction terminal, for example, its drain, coupled, preferably connected, to node 6062. The gate of transistor 608 is connected to the node 114 of logic gate 108.

The operation of gates 106 and 108, according to this third embodiment, is the following.

In an initialization phase, prior to each implementation of a comparison of voltages V+ and V−, signal sig2 is switched to the active state, for example, by a comparator control circuit. As a result, transistors 502 and 602 switch to the off state, which enables to electrically isolate the output 112 of gate 106 from node 304, and the output 112 of gate 108 from node 301. Then, still during the initialization phase, signal sig1 is then switched to the active state, for example, by the comparator control circuit, and transistors 500 and 600 are switched to the on state. As a result, the output 112 of gate 106 is set to the high state (Vdd) and the output 112 of gate 108 is set to the low state (GND). It should be noted that signal sig1 is switched to the active state after signal sig2 to avoid cross conduction in gates 106 and 108.

At the end of the initialization step, signals sig1 and sig2 are switched to the inactive state, while the input 110 of gate 106 is in the low state (GND) and the input 110 of gate 108 is in the high state (Vdd). As a result, transistors 500 and 600 switch to the off state, and transistors 502 and 602 switch to the on state. Since the input 110 of gate 106 is in the low state (GND), transistor(s) 504 are off. Further, since the input 110 of gate 108 is the high state (Vdd), transistor(s) 604 are off. The output 112 of gate 106 is thus in a high-impedance state and remains in the high state (Vdd), the output 112 of gate 108 also being in a high-impedance state and remaining in the low state (GND). It should be noted that the off state of transistor 500 and 600 at the end of the initialization step, while transistors 502 and 602 are on, enables to prevent cross conduction in gates 106 and 108.

During a next comparison phase, when the input 110 of gate 106 receives a rising edge, its input 110 switches to the high state (Vdd). As a result, transistor(s) 504 switch to the on state and pull the output 112 of gate 106 to the low state (GND), at a speed which depends on the voltage on the node 114 of gate 106. Further, when the input 110 of gate 108 receives a falling edge, its input 110 switches to the low state (GND). As a result, transistor(s) 604 switch to the on state and pull the output 112 of gate 108 to the high state (Vdd), at a speed which depends on the voltage on the node 114 of gate 118. It should be noted that the off state of transistors 500 and 600 during the comparison phase, while transistors 502 and 602 are on, enables to prevent cross conduction in gates 106 and 108.

A third embodiment where, during a phase of comparison of voltages V+ and V−, gate 106 receives a rising edge and gate 108 receives a falling edge has been described hereabove in relation with FIG. 5.

According to a fourth embodiment, not illustrated, a phase of comparison of voltages V+ and V− is triggered by a falling edge on node 104 (FIG. 2). In this fourth embodiment, each gate 106 is then implemented like gate 108 according to the third embodiment illustrated in FIG. 5, and each gate 108 is then implemented like gate 106 according to the third embodiment illustrated in FIG. 5.

Figure 6:
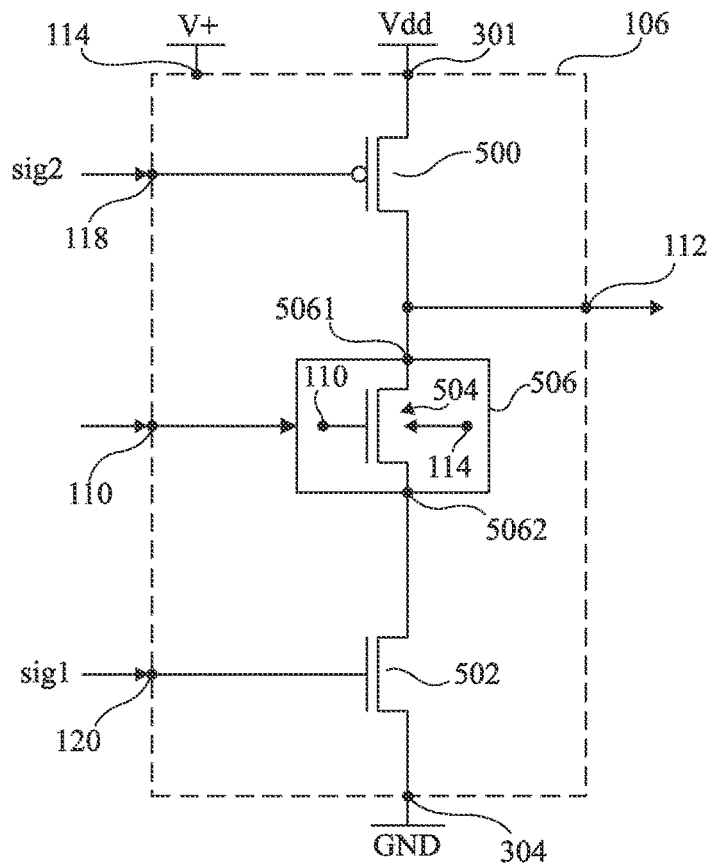
FIG. 6 shows an example of two gates of the comparator of FIG. 2 according to another alternative embodiment.
Figure 6:
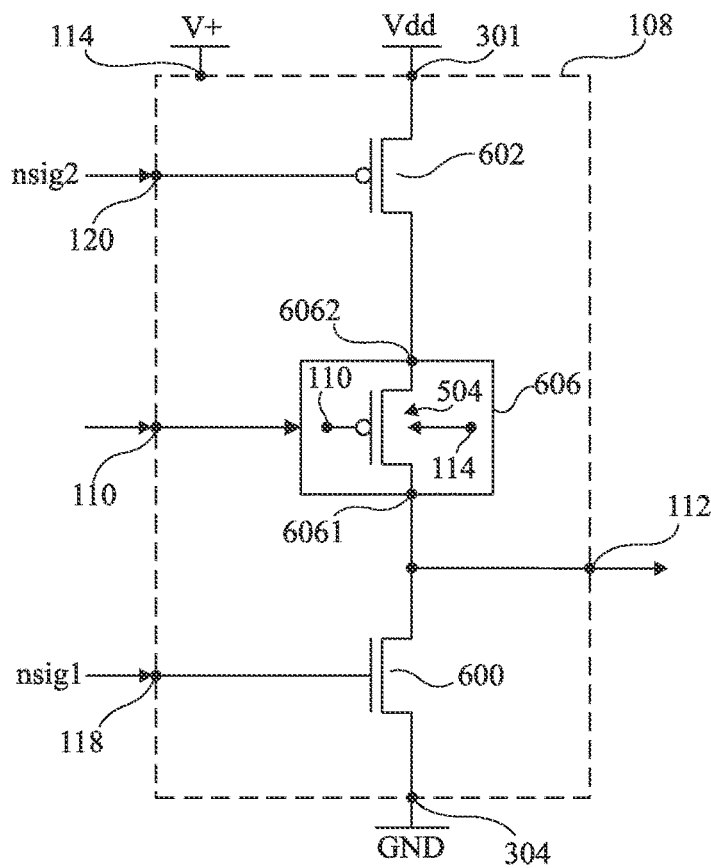

FIG. 6 shows an example of a gate 106 (at the top in FIG. 5) and of a gate 108 (at the bottom in FIG. 6) of the comparator 1 of FIG. 2, according to an alternative embodiment where advantage is taken of the a priori knowledge of the type of edge on the comparator node 104. More particularly, FIG. 6 illustrates a third embodiment where a rising edge is applied to node 104 (FIG. 2) to trigger a phase of comparison of voltages V+ and V−. Thus, in this third variant, during a phase of comparison of voltages V+ and V−, gate 106 receives a rising edge and gate 108 receives a falling edge. In the example of FIG. 6, gates 106 and 108 belong to branch 100 of the comparator 1 of FIG. 2, the node 114 of gate 106 receiving voltage V+ and the node 114 of gate 108 receiving voltage V−. In another example, not illustrated, these gates 106 and 108 belong to branch 102, and voltage V−, respectively V+, is received by the node 114 of gate 106, respectively 108.

The gate 106, respectively 108, according to a third alternative embodiment illustrated in FIG. 6 comprises many elements in common with the gate 106, respectively 108, according to the third embodiment illustrated in FIG. 5, and only the differences between these gates are here highlighted.

In FIG. 6, each transistor 504, respectively 604, of gate 106, respectively 108, is implemented from an SOI-type, preferably FDSOI-type, structure.

These transistors 504 and 604 then each comprise a back gate. The back gate of each transistor 504 of gate 106 is connected to the node 114 of gate 106, and the back gate of each transistor 604 of gate 108 is connected to the node 114 of gate 108. In this third variant, as illustrated in FIG. 6, the transistor 508 of gate 106 and the transistor 608 of gate 108 may be omitted. As a result, the gates 106 and 108 of FIG. 6 are more compact than the gates 106 and 108 of FIG. 5.

The operation of the gates 106 and 108 of FIG. 6 is identical to that of the gates 106 and 108 of FIG. 5 and will not be described again.

A third alternative embodiment where, during a phase of comparison of voltages V+ and V−, gate 106 receives a rising edge and gate 108 receives a falling edge has been described hereabove in relation with FIG. 6.

According to a fourth alternative embodiment, not illustrated, a phase of comparison of voltages V+ and V− is triggered by a falling edge on node 104 (FIG. 2), so that, during the comparison phase, gate 106 receives a falling edge and gate 108 receives a rising edge.

In this fourth alternative embodiment, each gate 106 is then implemented like gate 108 according to the third alternative embodiment illustrated in FIG. 6, and each gate 108 is then implemented like gate 106 according to the third alternative embodiment described in relation with FIG. 6.

The third alternative embodiment described in relation with FIG. 6 may be combined with the third embodiment described in relation with FIG. 5, and the fourth alternative embodiment may be combined with the fourth embodiment. The implementation of these combinations is within the abilities of those skilled in the art.

Preferably, in the third and fourth embodiments described in relation with FIG. 5, and in the third and fourth alternative embodiments described in relation with FIG. 6, the gates comprise a single transistor 504 and a single transistor 604.

Figure 7:
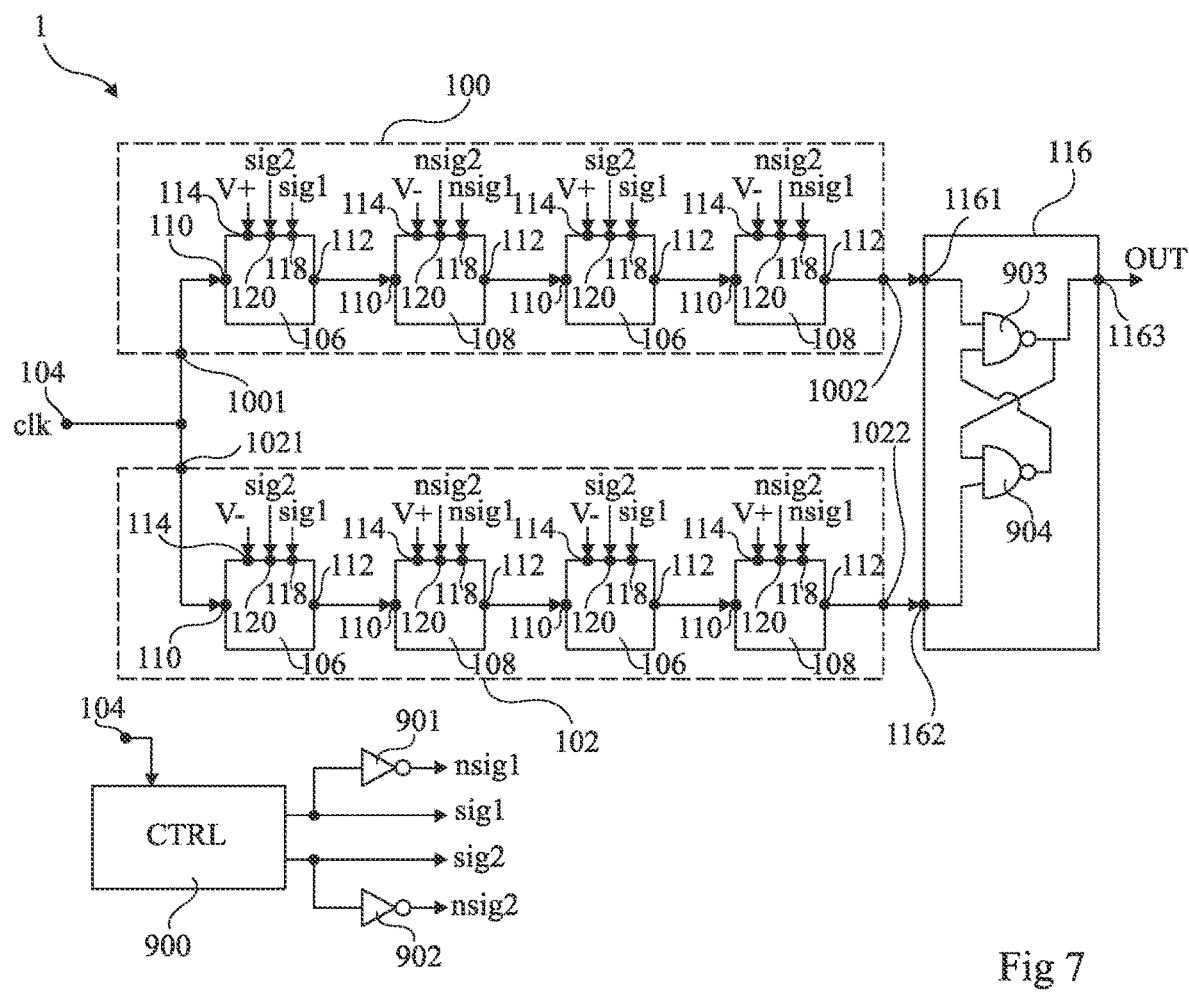
FIG. 7 shows an example of an alternative embodiment of the comparator of FIG. 2.

FIG. 7 shows an alternative embodiment of the comparator 1 of FIG. 2 where the gates 106, 108 of the comparator are implemented according to the third embodiment described in relation with FIG. 5, or according to the third alternative embodiment described in relation with FIG. 6. In other words, in FIG. 7, the edge applied to node 104 to trigger a phase of comparison of voltages V+ and V− is a rising edge.

The comparator of FIG. 7 comprises many similarities with the comparator of FIG. 2, and only the differences between these two comparators are here highlighted.

As compared with the comparator 1 of FIG. 2, in the comparator 1 of FIG. 7, gates 106, 108 each comprise control inputs 118 and 120. Further, the comparator 1 of FIG. 7 comprises a control circuit 900 (block "CTRL") configured to supply sig1 and sig2. Signal nsig1, respectively nsig2, is obtained from signal sig1, respectively sig2, for example, by means of an inverter 901, respectively 902. Inverters 901 and 902 may be external to circuit 900 as shown in FIG. 7, or, as a variant, form part of this circuit 900. As an example, circuit 900 is connected to node 104 to receive or supply the signal applied to this node 104, for example, clock signal clk. The implementation of circuit 900 is within the abilities of those skilled in the art based on the functional indications given hereabove.

As an example, the circuit 116 of the comparator is here implemented by two NAND gates 903 and 904 connected in a loop, an input of gate 903 being connected to the input 1161 of circuit 116, an input of gate 904 being connected to the input 1162 of circuit 116, and the output of gate 903 being connected to the output 1163 of circuit 116.

The comparator 1 of FIG. 7 illustrates the case where the edge applied to node 104 to trigger a phase of comparison of voltages V+ and V− is a rising edge, and where gates 106 and 108 are implemented according to the third embodiment or according to the third alternative embodiment. The implementation of comparator 1 in the case where the edge applied to node 104 to trigger a phase of comparison of voltages V+ and V− is a falling edge, from gates 106 and 108 according to the fourth embodiment or according to the fourth alternative embodiment is within the abilities of those skilled in the art.

An advantage of a dynamic comparator of FIG. 7 is that there is no cross conduction in the gates 106 and 108 of the comparator. This is true during the initialization phase due to the switching of signal sig2 to the active state before signal sig1 switches to the active state. Indeed, the active state of signal sig2 results in that transistors 502 and 602 are in the off state, and thus enable to cut the possible conductive path that there might be, in each logic gate, between nodes 301 and 304. Further, this is also true during the comparison phase due to the switching of signal sig1 to the inactive state. Indeed, the active state of signal sig1 results in that transistors 500 and 600 are in the off state, and thus enable to cut the possible conductive path that there might be, in each logic gate, between nodes 301 and 304.

Embodiments and variants of the comparator gates 106 and 108 have been described hereabove in relation with FIG. 5 and FIG. 6. Although this is not claimed herein, these gates may be used to form elementary structures capable of being implemented in circuits other than edge race dynamic comparators.

Figure 8:
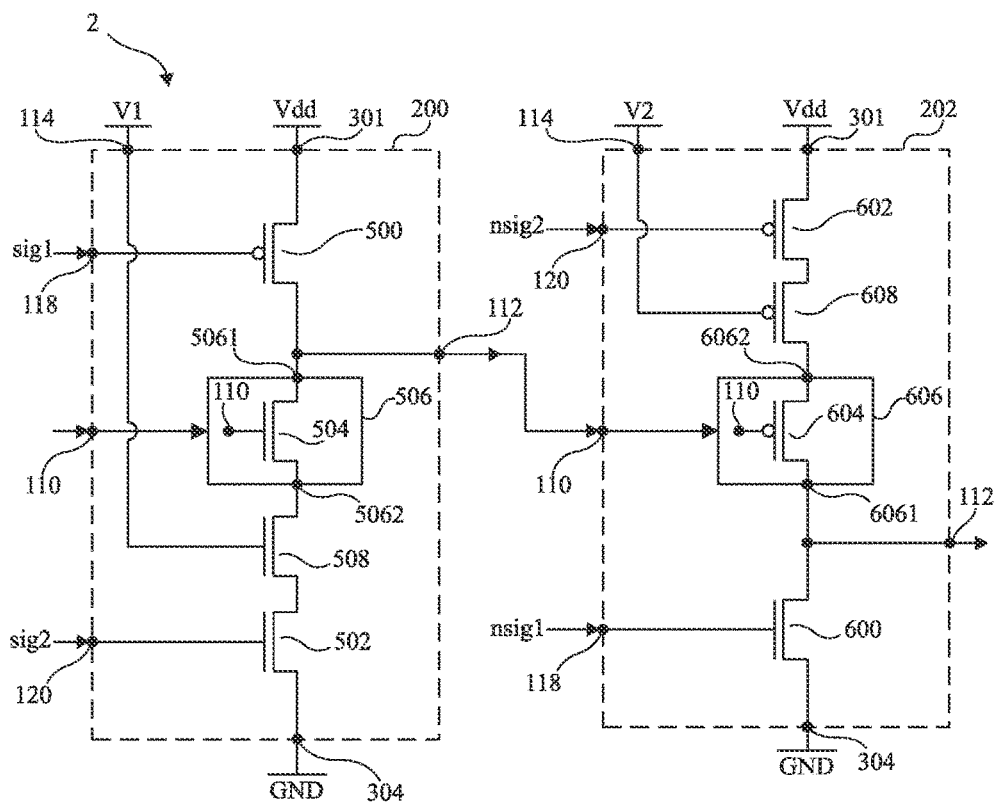
FIG. 8 shows an example of an elementary structure implemented from two gates of the type of that of FIG. 5.

FIG. 8 illustrates a first example of such an elementary structure 2. More particularly, in this first example, the elementary structure is configured to receive a rising edge. Elementary structure 2 then corresponds to the serializing of a gate 200 identical to gate 106 according to the third embodiment, and of a gate 202 identical to gate 108 according to the third embodiment, the output 112 of gate 200 being connected to the input 110 of gate 202.

In structure 2, the node 114 of gate 200 and the node 114 of gate 202 receive two different voltages, respectively V1 and V2. According to the values of these voltages V1 and V2, it is possible to set the delay introduced by structure 2 between the reception of a rising edge by the input of structure 2, that is, the input 110 of gate 200, and the supply of a corresponding rising edge at the output of the structure, that is, on the output 112 of gate 202.

It will be within the abilities of those skilled in the art to implement the structure 2 of FIG. 8 in the case where gate 200 is identical to gate 106 according to the third alternative embodiment and where gate 202 is identical to gate 108 according to the third alternative embodiment.

Figure 9:
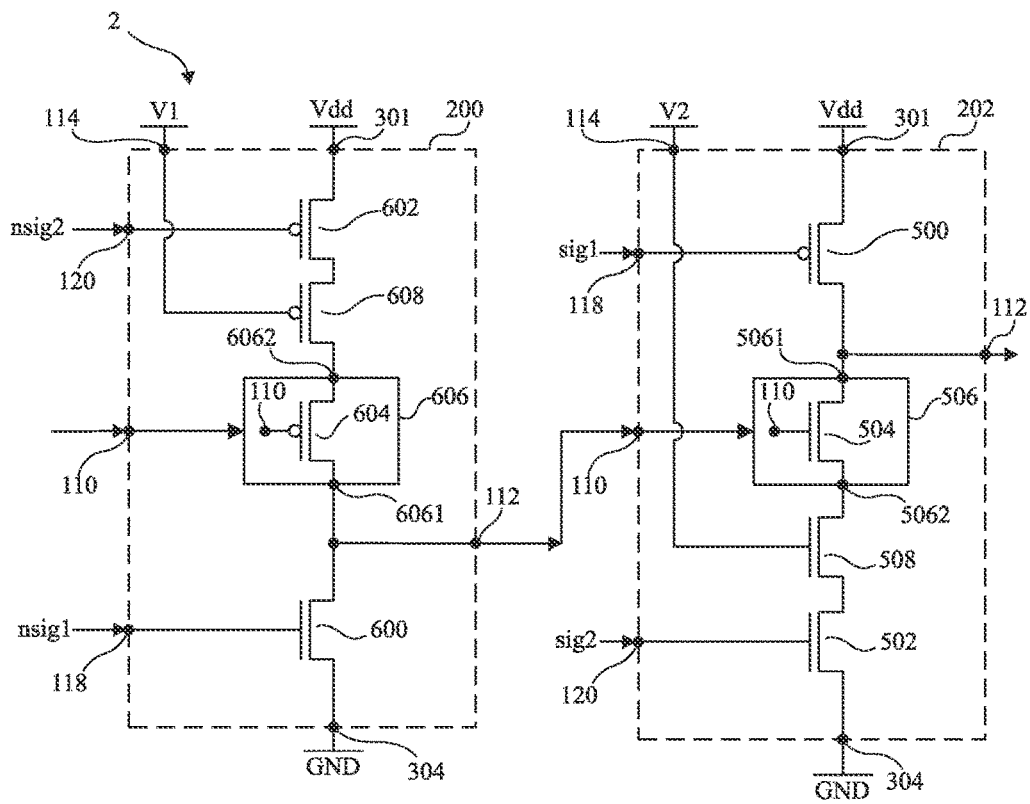
FIG. 9 shows another example of an elementary structure implemented from two gates of the type of those of FIG. 5.

FIG. 9 illustrates a second example of such an elementary structure 2. More particularly, in this second example, elementary structure 2 is configured to receive a falling edge. Elementary structure 2 then corresponds to the serializing of a gate 200 identical to gate 108 according to the third embodiment, and of a gate 202 identical to gate 106 according to the third embodiment, the output 112 of gate 200 being connected to the input 110 of gate 202. In other words, elementary structure 2 corresponds to the serializing of a gate 200 identical to gate 106 according to the fourth embodiment, and of a gate 202 identical to gate 108 according to the fourth embodiment.

As in FIG. 8, the node 114 of gate 200 and the node 114 of gate 202 receive two different voltages, respectively V1 and V2. According to the values of these voltages V1 and V2, it is possible to set the delay introduced by structure 2 between the reception of a falling edge by the input of structure 2 and the supply of a corresponding falling edge at the output of the structure.

It will be within the abilities of those skilled in the art to implement the structure 2 of FIG. 9 in the case where gate 200 is identical to gate 108 according to the third alternative embodiment and where gate 202 is identical to gate 106 according to the third alternative embodiment. In other words, it will be within the abilities of those skilled in the art to implement the structure 2 of FIG. 9 in the case where gate 200 is identical to gate 106 according to the fourth alternative embodiment, and where gate 202 is identical to gate 108 according to the fourth embodiment.

Thus, in the examples described hereabove in relation with FIG. 8 and FIG. 9, the first logic gate 200 of structure 2 comprises:

a first MOS transistor (500 in FIG. 8, 600 in FIG. 9) coupling the output 112 of logic gate 200 to a first node (301 in FIG. 8, 304 in FIG. 9); and a second transistor (502 in FIG. 8, 602 in FIG. 9) in series with a third transistor or an assembly of third transistors (504 in FIG. 8, 604 in FIG. 9), between the output 112 of logic gate 200 and a second node (304 in FIG. 8, 301 in FIG. 9), each third transistor having a gate connected to the input 110 of logic gate 200, and the second logic gate 202 comprises;

a fourth transistor (600 in FIG. 8, 500 in FIG. 9) coupling the output 112 of logic gate 202 to the second node (304 in FIG. 8, 301 in FIG. 9); and a fifth transistor (602 in FIG. 8, 502 in FIG. 9) in series with a sixth transistor or an assembly of sixth transistors (604 in FIG. 8, 504 in FIG. 9) between the output 112 of logic gate 202 and the first node (301 in FIG. 8, 304 in FIG. 9), each sixth transistor having a gate connected to the input 110 of logic gate 202.

In this structure 2, the first and fourth transistors are configured to be in the on state when signal sig1 is active, and the second and fifth transistors are configured to be in the off state when signal sig2 is active, to implement, prior to an edge propagation phase, a step of initialization of gates 200 and 202 such as previously described in relation with FIG. 5.

In this structure 2, the output 112 of first gate 200 is connected to the input 110 of second gate 202.

In this structure 2, the third transistor(s) of gate 200 (504 in FIG. 8, 604 in FIG. 9) are biased from the voltage V1 on the bias node 114 of gate 200, the sixth transistor(s) of gate 202 (604 in FIG. 8, 504 in FIG. 9) being biased from the voltage V2 on the bias node 114 of gate 200.

More particularly, according to a first implementation illustrated in FIG. 8 and FIG. 9, the first logic gate 200 further comprises a seventh transistor (508 in FIG. 8, 608 in FIG. 9) in series with the third transistor(s) (504 in FIG. 8, 604 in FIG. 9), between the second node (304 in FIG. 8, 301 in FIG. 9) and the output 112 of logic gate 200, the gate of the seventh transistor being connected to the node 114 of logic gate 200. According to this first implementation, the second logic gate 202 further comprises an eighth transistor (608 in FIG. 8, 508 in FIG. 9) in series with the sixth transistor(s) (604 in FIG. 8, 504 in FIG. 9), between the first node (301 in FIG. 8, 304 in FIG. 9) and the output 112 of logic gate 202, the gate of the eighth transistor being connected to the node 114 of logic gate 202.

According to a second implementation, not illustrated, each third transistor (504 in FIG. 8, 604 in FIG. 9) of first gate 200 is implemented from an SOI or FDSOI structure, and each sixth transistor (604 in FIG. 8, 504 in FIG. 9) of second gate 202 is implemented from a respectively SOI or FDSOI structure. In this second implementation, the back gate of each third transistor (504 in FIG. 8, 604 in FIG. 9) of the first logic gate 200 is connected to the node 114 of gate 200, the back gate of each sixth transistor (604 in FIG. 8, 504 in FIG. 9) of logic gate 202 being connected to the node 114 of gate 202. As compared with the first implementation, in the second implementation of structure 2, the seventh (508 in FIG. 8, 608 in FIG. 9) and eighth (608 in FIG. 8, 508 in FIG. 9) transistors may be omitted.

The structure 2 provided hereabove may for example be used as a delay element adapted to introducing a given delay in the propagation of an edge of a given previously-known type. The delay introduced is determined by voltages V1 and V2. This delay may advantageously be modified by modifying the difference between voltages V1 and V2, for example, during a calibration phase or during the use of structure 2 to take into account possible dispersions linked to variations of the operating temperature or of power supply voltage Vdd. AS an example, structure 2 is used as a delay element in a time-to-digital converter (or TDC).

Various embodiments and variants have been described. Those skilled in the art will understand that certain features of these various embodiments and variants may be combined, and other variants will occur to those skilled in the art. In particular, it will be within the abilities of those skilled in the art to adapt the embodiments and variants described in relation with FIG. 5, FIG. 6, FIG. 7, FIG. 8, and FIG. 9 to the case where signal sig1 is active in the high state and/or to the case where signal sig2 is active in the high state.

Finally, the practical implementation of the described embodiments and variations is within the abilities of those skilled in the art based on the functional indications given hereabove.

What is claimed is:

1. Dynamic comparator of a first voltage and of a second voltage comprising first and second branches each comprising a same succession of first and second alternated logic gates in series between a first node and an output of said branch, wherein:
   each branch starts with a first logic gate,
   each of the first and second logic gates has a second node configured to receive a bias voltage,
   the second node of each first logic gate of the first branch and of each second logic gate of the second branch receives the first voltage and the second node of each second logic gate of the first branch and of each first logic gate) of the second branch receiving the second voltage, so that an edge on the first node propagates through the first and second branches at speeds determined by the first and second voltages, and
   an order of arrival of the edges propagated by the first and second branches, on the outputs of said branches, determines a result of a comparison of the first and second voltages.

2. Comparator according to claim 1, wherein each of the first and second logic gates implements an inverting function.

3. Comparator according to claim 2, wherein the edge on the first node is a rising edge, the voltage on the second node of each first logic gate determining a speed of switching to the low state of said logic gate, and the voltage on the second node of each second logic gate determining a speed of switching to the high state of said logic gate, or wherein the edge on the first node is a falling edge, the voltage on the second node of each first logic gate determining a speed of switching to the high state of said logic gate, and the voltage on the second node of each second logic gate determining a speed of switching to the low state of said logic gate.

4. Comparator according to claim 2, wherein each of the first and second logic gates comprises:
   at least one first MOS transistor configured to switch said logic gate to the high state when said logic gate receives a rising edge; and
   at least one second MOS transistor configured to switch said logic gate to the low state when said logic gate receives a falling edge, and wherein:
   said at least one first transistor of each first logic gate is biased from the voltage on the second node of said logic gate and said at least one second transistor of each second logic gate is biased from the voltage on the second node of said logic gate, when the edge on the first node is a rising edge, or
   said at least one second transistor of each first logic gate is biased from the voltage on the second node of said logic gate and said at least one first transistor each second logic gate is biased from the voltage on the second node of said logic gate, when the edge on the first node is a falling edge.

5. Comparator according to claim 4, wherein each of the first and second gates comprises a third MOS transistor having a gate connected to the second node of said gate, the third transistor of each first gate being in series with said at least one first transistor when the edge on the first node is a falling edge, or in series with said at least one second transistor when the edge on the first node is a rising edge, and the third transistor of each second gate being in series with said at least one first transistor when the edge on the first node is a rising edge, or in series with said at least one second transistor when the edge on the first node is a falling edge.

6. Comparator according to claim 4, wherein the first and second transistor(s) of each first and second logic gates are implemented on semiconductor on insulator, possible on fully depleted semiconductor on insulator, and wherein:
   a back gate of each first transistor of each first logic gate is connected to the second node of said first logic gate and a back gate of each second transistor of each second logic gate is connected to the second node of said second logic gate when the edge on the first node is a falling edge; or a back gate of each second transistor of each first logic gate is connected to the second node of said first logic gate and a back gate of each first transistor of each second logic gate is connected to the second node of said second logic gate when the edge on the first node is a rising edge.

7. Comparator according to claim 4, wherein each of the first and second logic gates comprises a single first transistor and a single second transistor.

8. Comparator according to claim 1, wherein:
each first logic gate comprises:
a first MOS transistor coupling an output of said logic gate to a third node; and
a second transistor in series with a third transistor or an assembly of third transistors between the output of said logic gate and a fourth node, each third transistor having a gate connected to an input of said logic gate, and each third transistor being biased from the voltage on the second node of the logic gate,
each second logic gate comprises:
a fourth transistor coupling an output of said logic gate to the fourth node; and
a fifth transistor in series with a sixth transistor or an assembly of sixth transistors between the output of said logic gate and the third node, each sixth transistor having a gate connected to an input of said logic gate, and each sixth transistor being biased from the voltage on the second node of the logic gate;
the first and fourth transistors are configured to be in the on state when a first signal and fifth transistors are configured to be in the off state when a second signal is active; and
the third node is one of a node configured to receive a power supply voltage and of a node configured to receive a reference voltage, the fourth node being the other one of said nodes.

9. Comparator according to claim 8, wherein:
each first logic gate comprises a seventh MOS transistor having a gate connected to the second node of said first logic gate, the seventh transistor being in series with the second transistor between the fourth node and the output of said first logic gate; and
each second logic gate comprises an eighth MOS transistor having a gate connected to the second node of said second logic gate, the eighth transistor being in series with the fifth transistor between the third node and the output of said second logic gate.

10. Comparator according to claim 8, wherein:
each third transistor of each first logic gate is implemented on semiconductor on insulator, possibly on fully depleted semiconductor on insulator, and comprises a back gate connected to the second node of said logic gate; and
each fifth transistor of each second logic gate is implemented on semiconductor on insulator, possibly on fully depleted semiconductor on insulator, and comprises a back gate connected to the second node of said logic gate.

11. Comparator according to claim 8, wherein each first logic gate comprises a single third transistor and wherein each second logic gate comprises a single fifth transistor.

12. Comparator according to claim 8, further comprising a control circuit configured to:
switch the first signal to the active state and then the second signal to the active state during an initialization phase prior to a supply of said edge on the first node; and
switch the first and second signals to an inactive state at the end of the initialization phase.

13. Comparator according to claim 8, wherein:
the edge on the first node is a rising edge, the third node being the node of application of the power supply voltage and the fourth node being the node of application of the reference voltage; or
the edge on the first node is a falling edge, the third node being the node of application of the reference voltage and the fourth node being the node of application of the power supply voltage.

14. Comparator according to claim 1, further comprising a storage circuit comprising a first input connected to the output of the first branch, a second input connected to the output of the second branch, and an output determined by the order of arrival, on the first and second inputs, of the edges propagated by the first and second branches, the storage circuit for example comprising:
two NAND logic gates connected in a loop, one of the two logic gates having an input connected to the first input of said circuit and the other one of the two logic gates having an input connected to the second input of said circuit; or
two NOR logic gates connected in a loop, one of the two logic gates having an input connected to the first input of said circuit and the other one of the two logic gates having an input connected to the second input of said circuit; or
a D-type flip-flop.

15. Analog-to-digital converter comprising a comparator according to claim 1.

* * * * *